United States Patent
Aritome

(10) Patent No.: US 7,768,838 B2
(45) Date of Patent: Aug. 3, 2010

(54) OPERATING MEMORY CELLS

(75) Inventor: Seiichi Aritome, Zhudong (TW)

(73) Assignee: Micron Technology, Inc., Boise, ID (US)

( * ) Notice: Subject to any disclaimer, the term of this patent is extended or adjusted under 35 U.S.C. 154(b) by 334 days.

(21) Appl. No.: 11/928,640

(22) Filed: Oct. 30, 2007

(65) Prior Publication Data
US 2009/0109759 A1 Apr. 30, 2009

(51) Int. Cl.
G11C 11/34 (2006.01)
G11C 16/04 (2006.01)

(52) U.S. Cl. .......................... 365/185.24; 365/185.02; 365/185.17

(58) Field of Classification Search ............ 365/185.02, 365/185.24
See application file for complete search history.

(56) References Cited
U.S. PATENT DOCUMENTS 7,518,931 B2 * 4/2009 Shim ...................... 365/185.24
7,567,455 B2 * 7/2009 Khaef ..................... 365/185.02
2008/0055979 A1 * 3/2008 Shim ...................... 365/185.02
2008/0075027 A1 * 3/2008 Lee et al. ..................... 370/311
2008/0116506 A1 * 5/2008 Lue ........................... 257/324

* cited by examiner

Primary Examiner—Ly D Pham
(74) Attorney, Agent, or Firm—Brooks, Cameron & Huebsch, PLLC

(57) ABSTRACT

Embodiments of the present disclosure provide methods, devices, modules, and systems for reading non-volatile memory cells. One method includes programming a number of memory cells coupled in series between a first and second select gate transistor where edge cells are coupled adjacent to the select gate transistors and non-edge cells are coupled between the edge cells. The method includes programming a non-edge cell within a first threshold voltage (Vt) distribution. The method also includes programming an edge cell within a second Vt distribution, wherein the first and second Vt distributions correspond to a same one of a number of data states, and wherein the second Vt distribution is different than the first Vt distribution for at least one of the number of data states.

17 Claims, 6 Drawing Sheets

| | ERASE | ERASE VERIFY | PROGRAM (WL-0) | READ (WL-0READ) | READ (WL-0READ) |
|---|---|---|---|---|---|
| BL | FLOATING | 0 V | 0 V/Vcc | 1.0 V | 1.0 V |
| SGD | FLOATING | 3.5 V | Vcc→1.0 V | (3.5 V) Vpass-read | (3.5 V) Vpass-read |
| WL-31 | 0 V | 0.5 V | Vpass (10V) | Vpass-read+ 0.5V | Vpass-read |
| WL-30 | 0 V | 0 V | Vpass | Vpass-read | Vpass-read |
| WL-29 | 0 V | 0 V | Vpass | Vpass-read | Vpass-read |
| ⋮ | | | | | |
| WL-1 | 0 V | 0 V | Vpass | Vpass-read | Vpass-read |
| WL-0 | 0 V | 0.5 V | Vpgm+0.5V | Vread+0.5 V | Vread+0.5 V |
| SGS | FLOATING | 3.5 V | 0 V | 3.5 V | 3.5 V |
| SOURCE | FLOATING | 1.5 V | Vcc | 0 V | 0 V |
| P-well (+N-well) | Vera=20 V | 0 V | 0 V | 0 V | 0 V |

*Fig. 4*

ОПЕРATING MEMORY CELLS

OPERATING MEMORY CELLS

TECHNICAL FIELD

The present disclosure relates generally to semiconductor devices and, more particularly, in one or more embodiments, to sensing non-volatile memory cells.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory, among others.

Flash memory devices are utilized as non-volatile memory for a wide range of electronic applications. Flash memory devices typically use a one-transistor memory cell that allows for high memory densities, high reliability, and low power consumption.

Uses for flash memory include memory for personal computers, personal digital assistants (PDAs), digital cameras, and cellular telephones. Program code and system data, such as a basic input/output system (BIOS), are typically stored in flash memory devices. This information can be used in personal computer systems, among others.

Two common types of flash memory array architectures are the "NAND" and "NOR" architectures, so called for the logical form in which the basic memory cell configuration of each is arranged.

A NAND array architecture arranges its array of floating gate memory cells in a matrix such that the gates of each floating gate memory cell of the array are coupled by rows to select lines. However each memory cell is not directly coupled to a column sense line by its drain. Instead, the memory cells of the array are coupled together in series, source to drain, between a source line and a column sense line.

Memory cells in an array architecture can be programmed to a desired state. That is, electric charge can be placed on or removed from the floating gate of a memory cell to put the cell into a number of data states. For example, a single level cell (SLC) can represent two data states, e.g., 1 or 0. Flash memory cells can also store more than two data states, e.g., 1111, 0111, 0011, 1011, 1001, 0001, 0101, 1101, 1100, 0100, 0000, 1000, 1010, 0010, 0110, and 1110. Such cells may be referred to as multi state memory cells, multidigit cells, or multilevel cells (MLCs). MLCs can allow the manufacture of higher density memories without increasing the number of memory cells since each cell can represent more than one digit, e.g., more than one bit. MLCs can have more than one programmed state, e.g., a cell capable of representing four digits can have sixteen data states including an erased state.

MLC memory stores multiple digits on each cell by using different threshold voltage (Vt) levels for each state that is stored. The difference between adjacent Vt distributions may be very small for a MLC memory device as compared to a SLC memory device. The reduced margins between adjacent Vt distributions can increase the difficulty associated with distinguishing between adjacent data states, which can lead to problems such as reduced data read and/or data retrieval reliability.

Memory cells may be coupled in series between a source line and a sense line. The memory cells may be located on the string between a select gate source transistor and a select gate drain transistor. The cells adjacent to the select gate transistors are referred to herein as edge cells. The cells between the edge cells are referred to herein as non-edge cells.

The cell current associated with an edge cell after an erase operation can be higher than the cell current associated with a non-edge cell due to factors such as slow erase effects. Memory cells affected by slow erase effects can become unreliable, e.g., an erase verify operation performed on a memory cell affected by slow erase effects could fail. Slow erase effects tend to affect edge cells more than non-edge cells because of their different coupling ratios.

BRIEF DESCRIPTION OF THE DRAWINGS

FIG. 4 illustrates a table of operating voltages that can be used in accordance with one or more embodiments of the present disclosure.

DETAILED DESCRIPTION

Embodiments of the present disclosure provide methods, devices, modules, and systems for operating non-volatile memory cells. One method includes programming a number of memory cells coupled in series between a first and second select gate transistor where edge cells are coupled adjacent to the select gate transistors and non-edge cells are coupled between the edge cells. The method includes programming a non-edge cell within a first threshold voltage (Vt) distribution. The method also includes programming an edge cell within a second Vt distribution, wherein the first and second Vt distributions correspond to a same one of a number of data states, and wherein the second Vt distribution is different than the first Vt distribution for at least one of the number of data states.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, or mechanical changes may be made without departing from the scope of the present disclosure.

Hereinafter, the terms "wafer" and "substrate" are used interchangeably and are to be understood as including silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation.

Figure 1:
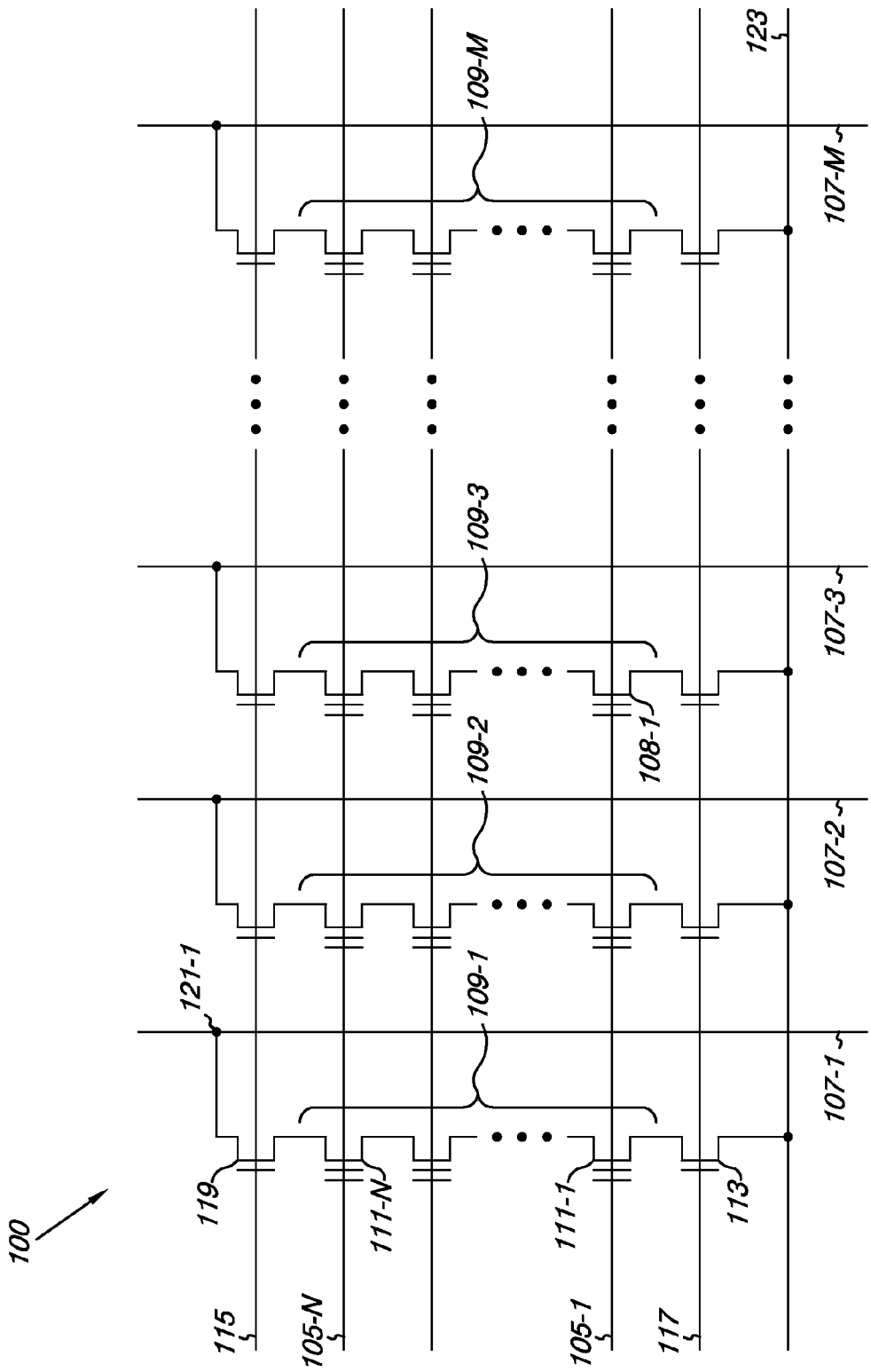
FIG. 1 is a schematic of a portion of a non-volatile memory array that can be used with one or more embodiments of the present disclosure.

FIG. 1 is a schematic of a portion of a non-volatile memory array 100. The embodiment of FIG. 1 illustrates a NAND architecture non-volatile memory. However, embodiments described herein are not limited to this example. In one or more embodiments, the array 100 includes some multilevel memory cells (MLCs).

As shown in FIG. 1, the memory array 100 includes select lines 105-1, . . . , 105-N and intersecting sense lines 107-1, . . . , 107-M. For ease of addressing in the digital environment, the number of select lines 105-1, . . . , 105-N and the number of sense lines 107-1, . . . , 107-M are each some power of two, e.g., 256 select lines by 4,096 sense lines. The indicators "M" and "N" are used to indicate that the array 100 can include a number of select lines and a number of sense lines.

Memory array 100 includes NAND strings 109-1, . . . , 109-M. Each NAND string includes non-volatile memory cells 111-1, . . . , 111-N, each located at an intersection of a select line 105-1, . . . , 105-N and a local sense line 107-1, . . . , 107-M. The non-volatile memory cells 111-1, . . . , 111-N of each NAND string 109-1, . . . , 109-M are connected in series source to drain between a select gate source (SGS) transistor, e.g., a field-effect transistor (FET) 113, and a select gate drain (SGD) transistor, e.g., FET 119. Source select gate 113 is located at the intersection of a local sense line 107-1 and a source select line 117 while drain select gate 119 is located at the intersection of a local sense line 107-1 and a drain select line 115.

As shown in the embodiment illustrated in FIG. 1, a source of source select gate 113 is connected to a common source line 123. The drain of source select gate 113 is connected to the source of the memory cell 111-1 of the corresponding NAND string 109-1. The drain of drain select gate 119 is connected to the local sense line 107-1 for the corresponding NAND string 109-1 at drain contact 121-1. The source of drain select gate 119 is connected to the drain of the last memory cell 111-N, e.g., floating-gate transistor, of the corresponding NAND string 109-1.

In one or more embodiments, construction of non-volatile memory cells 111-1, . . . , 111-N includes a source, a drain, a floating gate or other charge storage layer, and a control gate. Non-volatile memory cells, 111-1, . . . , 111-N, have their control gates coupled to a select line, 105-1, . . . , 105-N, respectively. A column of the non-volatile memory cells 111-1, . . . , 111-N make up the NAND strings, e.g., 109-1, . . . , 109-M, coupled to a given local sense line, e.g., 107-1, . . . , 107-M, respectively. A row of the non-volatile memory cells are commonly coupled to a given select line, e.g., 105-1, . . . , 105-N. A NOR array architecture would be similarly laid out except that the string of memory cells would be coupled in parallel between the select gates.

As will be described further below in connection with FIGS. 3A, 3B, and 4, one or more embodiments of the present disclosure can be used to reduce erase status failures associated with operating an array of non-volatile memory cells, e.g., array 100. For example, an operation in accordance with one or more embodiments of the present disclosure can be performed on one or more edge memory cells, e.g., 111-1, . . . , 111-N. In such embodiments, the operation can be used to account for extra charge left on edge cells, e.g., 111-1 of the string due to slow erase characteristics of the NAND array. As used herein, an edge cell refers to a memory cell adjacent to a select gate, e.g., memory cell 111-1 of FIG. 1 is an edge cell adjacent to select gate 113 and memory cell 111-N is an edge cell adjacent to select gate 119.

Figure 2:
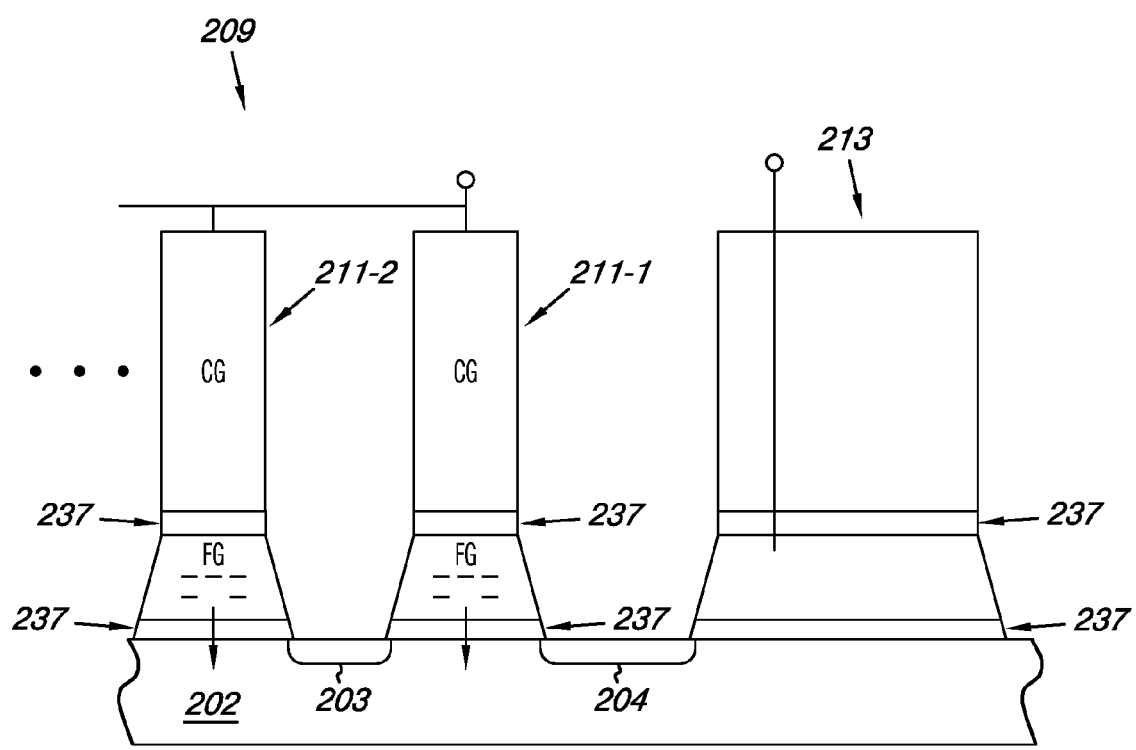
FIG. 2 illustrates a cross-sectional diagram of a portion of a string of non-volatile memory cells that can be used with one or more embodiments of the present disclosure.

FIG. 2 illustrates a cross-sectional diagram of a portion of a string 209, e.g., string 109-1 to 109-M shown in FIG. 1, of non-volatile memory cells. The string 209 is a NAND string 209 that includes a number of memory cells 211-1/211-2 and a select gate transistor 213. In one or more embodiments, the memory cell 211-1 is an edge memory cell and the memory cell 211-2 is a non-edge memory cell, e.g., a cell which is not adjacent to a select gate transistor associated with the string. In one or more embodiments, the select gate transistor 213 is a source select gate transistor 213, e.g., a select gate transistor which couples the string 209 to a common source line, e.g., source line 123 shown in FIG. 1.

As shown in FIG. 2, the memory cells 211-1/211-2 have a gate stack configuration including a control gate (CG) and a floating gate (FG) formed over a substrate 202. In the embodiment illustrated in FIG. 2, the substrate 202 is a p-type silicon substrate 202 implanted with n+ diffusion regions 203 and 204 that act as the source/drain regions for the memory cells 211-1/211-2. The substrate 202 can be referred to as the substrate body region, e.g., P-well region in this example. In one or more embodiments, the substrate 202 can be an n-type substrate implanted with p+ diffusion regions 203 and 204 such that the substrate body is an N-well region.

As shown in FIG. 2, a dielectric layer 237 is formed on the substrate 202. The floating gates of memory cells 211-1/211-2 can be formed over the dielectric layer 237. The dielectric layer 237 is also located between adjacent memory cell gate stacks 211-1/211-2 and between the edge cell 211-1 and the select gate 213 above at least a portion of the diffusion regions 203 and 204. The dielectric layer 237 can be silicon dioxide or another dielectric material. In one or more embodiments, the dielectric layer 237 can include a number of layers of the same or different dielectric material(s) and can be located above and/or around the source/drain regions 203 and 204.

As one of ordinary skill in the art will appreciate, an erase operation includes applying a relatively high potential difference between the control gates of the memory cells 211-1/211-2 and the substrate 202 in order to remove charge, e.g., electrons, from the floating gates of the cells 211-1/211-2. For example, 20V is applied to the substrate body 202 and 0V is applied to the control gates of the cells 211-1/211-2. The high voltage erase pulse is intended to inject electrons from the floating gates of the memory cells into the substrate active area 202. The edge cell 211-1 has a different coupling ratio than non-edge cells, including 211-2. For this reason, the erase operation has a slower effect on edge cells. The result of the slow erase effect is that more charge may be left on the edge cells than non-edge cells after an erase operation. The presence of the residual charge can lead to an erase verify failure when an erase verify operation is performed.

Figure 3A:
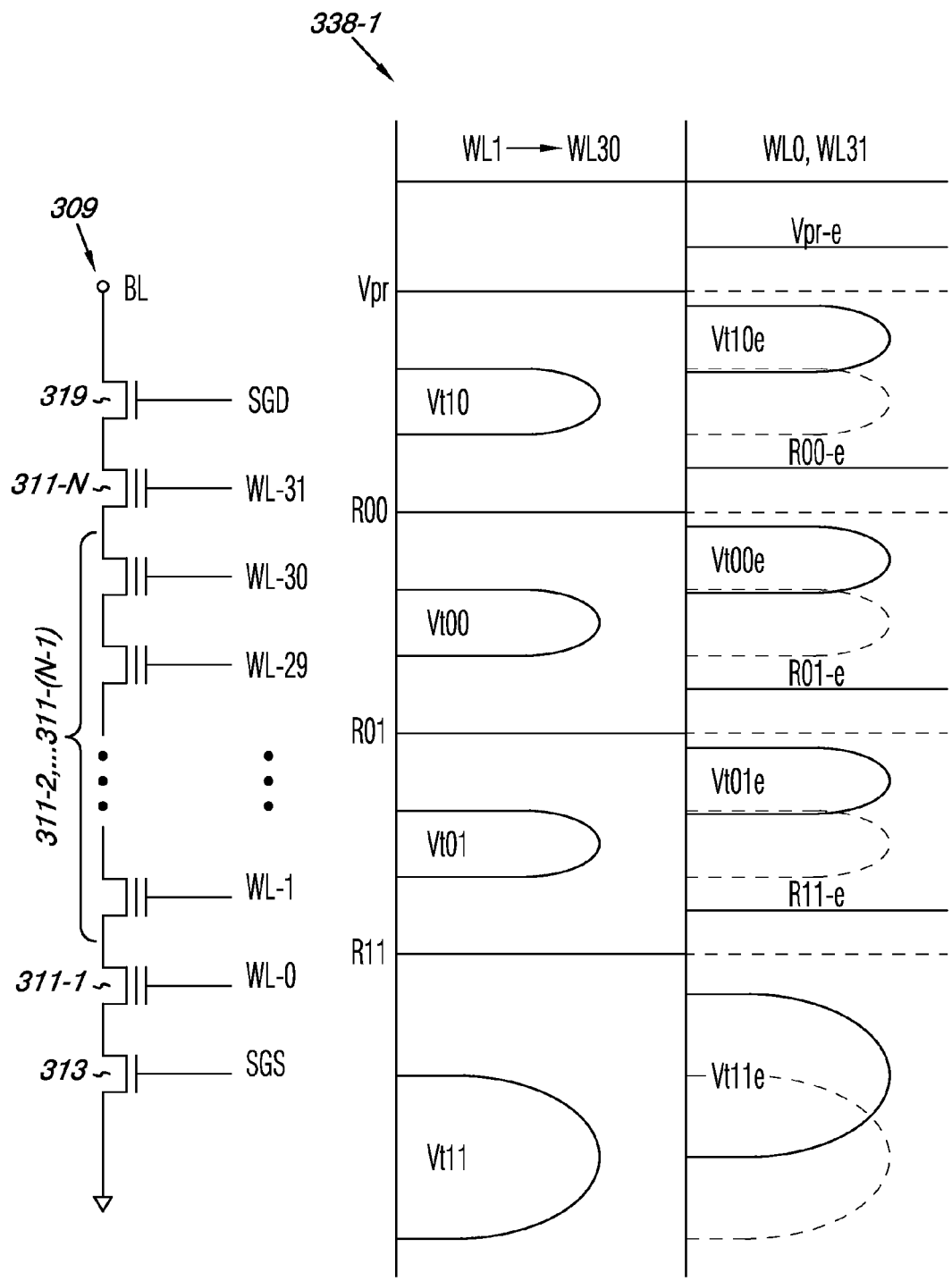
FIG. 3A illustrates a diagram of sensing voltages and threshold voltage distributions that can be used in accordance with one or more embodiments of the present disclosure.
Figure 3B:
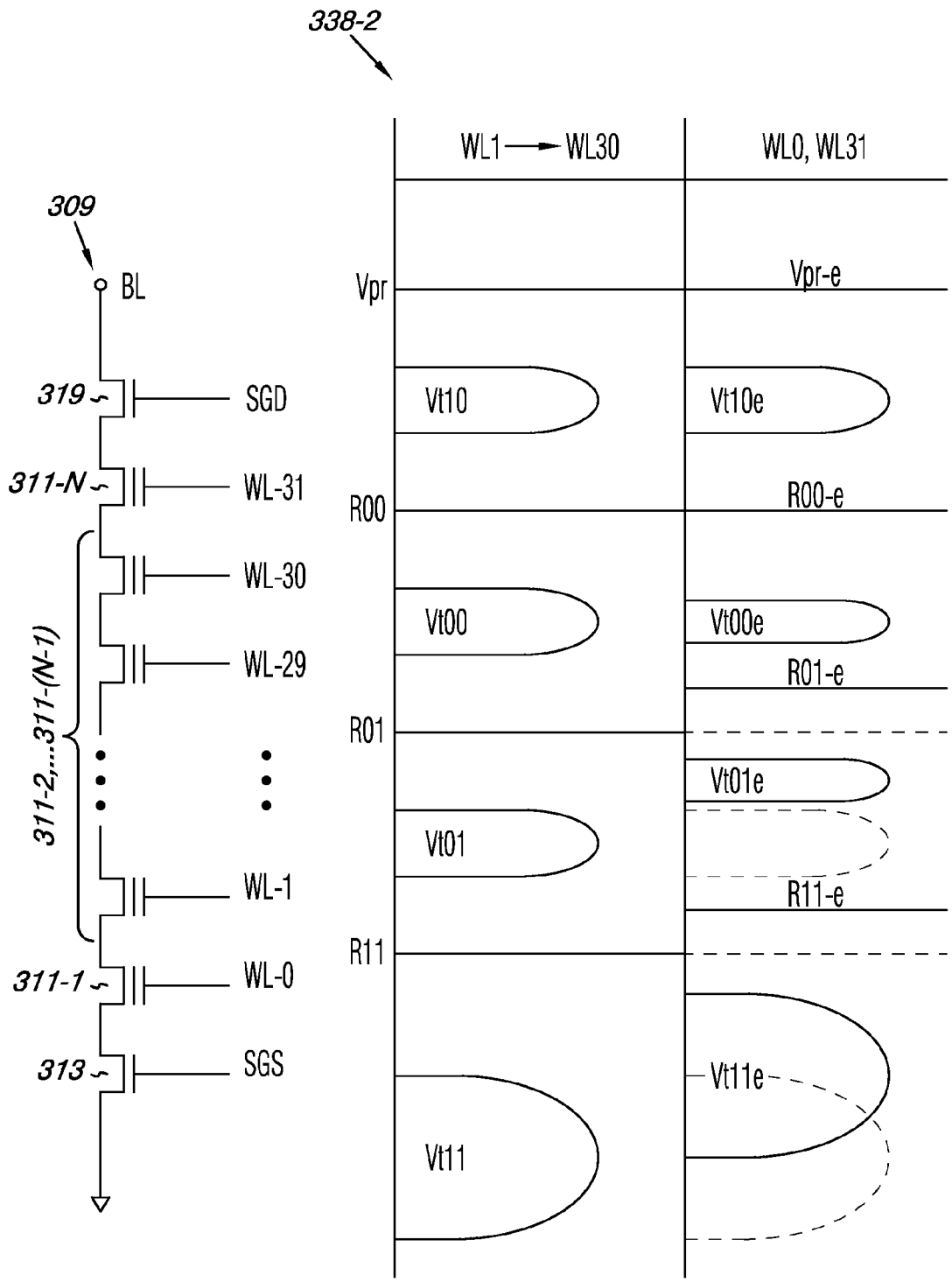
FIG. 3B illustrates another diagram of sensing voltages and threshold voltage distributions that can be used in accordance with one or more embodiments of the present disclosure.

FIGS. 3A and 3B illustrate diagrams of sensing voltages and threshold voltage distributions that can be used in accordance with one or more embodiments of the present disclosure. Sensing voltages can be used in association with one or more program and/or program verify operations. The string 309, e.g., string 109-1 to 109-M shown in FIG. 1, is a NAND string of non-volatile memory cells. The string 309 is coupled in series between a select gate source transistor 313, e.g., SGS and a select gate drain transistor 319, e.g., SOD. The string 309 is coupled to a sense line BL, e.g. sense line 107-1 in FIG. 1. Non edge memory cells 311-2, . . . , 311-(N−1), e.g., WL-1 . . . WL-30, are indicated on string 309 and correspond to the sensing voltages and Vt distributions in the first column, labeled WL1→WL30, of the diagrams 338-1 and 338-2. Edge memory cells 311-1 and 311-N, e.g., WL-0 and WL-31, in this example, are adjacent to a select gate transistor on the string. The edge memory cells correspond to the sensing voltages and Vt distributions in the second column, labeled WL0, WL31, of the diagrams 338-1 and 338-2.

FIGS. 3A and 3B display two columns in diagrams 338-1 and 338-2 labeled WL1→WL30 and WL0, WL31. The first column WL1→WL30 represents sensing voltages and Vt distributions for non-edge cells 311-2, ..., 311-(N−1) for a number of data states 11, 01, 00, 10. The second column represents sensing voltages and Vt distributions for edge cells 311-1 and 311-N. The sensing voltages R11, R01, R00, and Vpr for non-edge cells are labeled according to the associated data state. The sensing voltages R11-*e*, R01-*e*, R00-*e*, and Vpr-*e* for edge cells are also labeled according to the associated data state. The Vt distributions Vt11, Vt01, Vt00, and Vt10 for non-edge cells are labeled according to the associated data state. The Vt distributions Vt11*e*, Vt01*e*, Vt00*e*, and Vt10*e* for edge cells are also labeled according to the associated data state.

FIG. 3A illustrates an embodiment in which, for data states 11, 01, 00, 10, the sensing voltages R11-*e*, R01-*e*, R00-*e*, and R10-*e* are higher for edge cells 311-1 and 311-N than for non-edge cells 311-2, ..., 311-(N−1). As is shown in this embodiment, for all data states 11, 01, 00, 10, the average values of Vt distributions Vt11*e*, Vt01*e*, Vt06*e*, and Vt10*e* are higher for edge cells 311-1 and 311-N, e.g., WL-0 and WL-31, than for non edge cells 311-2, ..., 311-(N−1), e.g., WL1-WL-30. The embodiment described herein is only an example and is not intended to limit the scope of the claims. For example, a memory cell could contain more or less data states than those described here.

FIG. 3B is an embodiment of the present disclosure where, for the first two data states 11 and 01, the sensing voltages R11-*e* and R01-*e* are greater for edge cells 311-1 and 311-N than the sensing voltages R11 and R01 for non-edge cells 311-2, ..., 311-(N−1). For data states 00 and 10, the sensing voltages for non-edge cells R00 and Vpr are equal to those for edge cells R00-*e* and Vpr-*e*. As is shown for the first two data states 11 and 01, the average values of Vt distributions for edge cells Vt11*e* and Vt01*e* are higher than the average values of Vt distributions for non-edge cells Vt11 and Vt01. However, for data states 00 and 10, the average values of Vt distributions Vt00*e* and Vt10*e* are the same as for Vt00 and Vt01 respectively. The ranges of voltages for the Vt distributions Vt01*e* and Vt00*e* for edge cells are narrower than the ranges of voltages for the Vt distributions Vt01 and Vt00 for non-edge cells. For example, an array of memory cells could have more or less data states than are illustrated in the example embodiment of FIG. 3.

Erase operations performed on string 309 are intended to return the memory cells 311-1, ..., 311-N to the erased state 11. However, slow erase effects can occur on edge cells 311-1 and 311-N because their coupling ratios are different than the coupling ratios associated with non-edge cells 311-2, ..., 311-(N−1). Slow erase effects can leave a residual charge on the edge cells 311-1 and 311-N after the erase operation. A subsequent erase verify operation on an edge cell with a residual charge could result in an erase verify failure if the residual charge is higher than the erase verify voltage. Likewise, if a cell is programmed to the erased state 11, and a slow erase effect occurs, the cell could be read in data state 01 rather than data state 11, i.e., the erased state. The embodiments illustrated in FIGS. 3A and 3B compensate for the residual charge left after an erase operation (or a program operation to the erased state) by increasing the sensing voltage R11 to R11-*c* for edge cells 311-1 and 311-N to allow the cell to be read in the correct data state even if a residual charge is present on the cell. The further differences in embodiments 3A and 3B respond to the changes caused by increasing the values of R11 to R11-*e* for edge cells as described below.

For example, the embodiment of FIG. 3A illustrates increasing each sensing voltage R11-*e*, R01-*e*, R00-*e*, and Vpr-*e* for edge cells 311-1 and 311-N. It also depicts increasing the average value of each Vt distribution to Vt11*e*, Vt01*e*, Vt00*e*, and Vt10*e* for edge cells 311-1 and 311-N. Increasing all sensing voltages and Vt distributions preserves the margins between the Vt distributions and the sensing voltages. If a sensing voltage was increased without adjusting the associated Vt distribution, there would be less of a voltage margin between the sensing voltage and the Vt distribution. As one of ordinary skill in the art will appreciate, a smaller margin between a sensing voltage and Vt distribution requires greater precision in applying a program voltage so that it falls strictly within the Vt distribution to avoid over or under programming the cell for the desired data state.

For example, the embodiment of FIG. 3B illustrates increasing the sensing voltages R11-*e* and R01-*e* (the first two data states) for edge cells 311-1 and 311-N. It also depicts increasing the average values of Vt distributions to Vt11*e* and Vt01*e*. Another difference for edge cells 311-1 and 311-N is that the Vt distributions Vt01*e* and Vt00*e* for data states 01 and 00 have a narrower range of voltages than the Vt distributions Vt01 and Vt00 for non-edge cells 311-2, ..., 311-(N−1). In one or more embodiments the smaller margin created by adjusting the sensing voltages to R11-*e* and R01-*e* is accounted for by narrowing the Vt distributions Vt01*e* and Vt00*e*. In one or more embodiment edge cells 311-1 and 311-N would be programmed to a greater tolerance for data states 01 and 00 than non-edge cells to account for the narrower margin 311-2, ..., 311-(N−1).

FIG. 4 illustrates a table 410 of operating voltages that can be used in accordance with one or more embodiments of the present disclosure. The table 410 illustrates voltages applied to a sense line (BL), a drain select line (SGD), a number of select lines (WL-0 through WL-31), a source select line (SGS), a common source line (SOURCE), and a substrate body (P-well) associated with a string 409 of non-volatile memory cells coupled in series between a select gate source transistor and a select gate drain transistor. The table 410 illustrates examples of voltages applied to the string 409 during an erase operation (ERASE), erase verify operation (ERASE VERIFY), a program operation (PROGRAM WL-0), and two read operations (READ WL-0READ) 439-1 and 439-2. The first read operation (READ WL-0READ) 439-1 corresponds to FIG. 3A. The second read operation (READ WL-0READ) 439-2 corresponds to FIG. 3B.

In one or more erase verify operation embodiments, as shown in table 410, a sense line (BL) is biased at 0V, a common source line (SOURCE) is biased at 1.5V. One of ordinary skill in the art will appreciate that the sense line and source could be oppositely biased, or have different voltages applied. In one or more embodiments, a first select gate transistor, e.g., a select gate source transistor, coupled to a string of memory cells is biased at a first voltage while a second select gate transistor, e.g., a select gate drain transistor, coupled to the string is biased at a second voltage. In one or more embodiments, and as shown in FIG. 4, the first and the second voltages applied to the first and second select gate transistors can be the same voltage, e.g., 3.5V in this example. In one or more embodiments, the select gate transistors are biased at a voltage of between 0V and 5V. In one or more embodiments, non-edge select lines are biased at the same voltage, e.g. 0V in this example. In one or more embodiments, edge-select lines are biased at a higher voltage than the non-edge select lines during an erase verify operation, e.g., 0.5V in this example. Embodiments are not so limited.

An erase verify failure can result if any of the cells in the string is determined to be in a state other than the erased state, e.g., if any of the cells is determined to have a threshold voltage level greater than 0V in this example. As discussed above with respect to FIGS. 3A and 3B, an erase operation performed on the string 409 can have different effects on edge cells 411-1 and 411-N than non-edge cells 411-2, . . . , 411-(N−1). More residual charge may remain on an edge cell than a non-edge cell, leading to erase verify failures. The erase verify operation described above helps compensate for slow erase effects on edge cells 411-1 and 411-N by reducing the incidence of erase verify failures for edge cells 411-1 and 411-N.

As one of ordinary skill in the art will appreciate, in a read operation performed on a selected memory cell in a NAND string, the unselected memory cells of the string are biased so as to be in a conducting state. Such unselected memory cells are said to have a pass-read voltage applied to them. An example of operating voltages associated with a read operation is shown in FIG. 4. In such a read operation, the data stored in the selected cell can be based on the current and/or voltage sensed on the sense line corresponding to the string. For instance, data stored in the selected cell can be based on whether the sense line voltage changes by a particular amount or reaches a particular level in a given time period.

When the selected cell is in a conductive state, current flows between the source line contact at one end of the string and a sense line contact at the other end of the string. As such, the current associated with reading the selected cell is carried through each of the other cells in the string, the diffused regions between cell stacks, and the select transistors.

In one or more operational reading embodiments, a first select gate transistor, e.g., a select gate source transistor, coupled to a string of memory cells is biased at a first voltage while a second select gate transistor, e.g., a select gate drain transistor, coupled to the string is biased at a second voltage. As shown in FIG. 4, the first and the second voltages applied to the first and second select gate transistors can be the same voltage, e.g., 3.5V. The select gate transistors are biased at a voltage of between 0V and 5V. Non-edge select lines that are not selected for reading are biased with a pass-read voltage Vpass-read in column 439-1. Edge select lines that are not selected for reading are biased with a higher pass-read voltage to compensate for slow erase effects on edge select lines Vpass-read +0.5V in column 439-1 for WL-31. In one or more embodiments, edge select lines that are not selected for reading are biased at the same pass-read voltage as non-edge select lines Vpass-read in column 439-2 for WL-31.

In this operational embodiment example, edge-select lines selected for reading are biased at a higher voltage than non-edge select lines selected for reading. Although not shown in table 410, a non-edge select line could be biased at, for example, 0V for reading. In the example in column 439-1, edge select line WL-0 is selected for reading and is biased at 0.5V to compensate for the slow erase effects on edge select lines. Although not shown in table 410, an edge select line is biased at the same voltage as non-edge select lines when selected for reading. The difference in read voltage applied to edge cells versus non-edge cells to compensate for slow erase effects is not limited to 0.5V as illustrated in this embodiment.

As shown in the example embodiment of FIG. 4, table 410, a reading operation, e.g., READ (WL-0READ) 439-1, can include biasing the sense line (BL) at a voltage of, for example, 1.0V, and the source line (SOURCE), and the substrate body (P-well) associated with the string of cells, e.g., string 409, at a ground voltage, e.g., 0V. Again, embodiments are not limited to the example voltages illustrated in table 410. For instance, in one or more embodiments, the sense line, source line, and substrate body associated with a string, e.g., 409, can each be biased at different voltages. Biasing at least the substrate body, the select gate source line (SGS), and the select gate drain line (SOD) at a low voltage with respect to the pass-read voltage (Vpass-read) can facilitate reading the selected cell, which is biased with a voltage lower than the pass-read voltage. In table 410, column 439-1, for example, the pass-read voltage for non-edge cells is 3.5V, the pass-read voltage for edge cells is 4.0V and the read voltage for edge cells is 0.5V. Biasing edge select lines with relatively higher read and/or pass-read voltages with respect to non-edge select lines helps to compensate for slow erase effects on edge select lines.

Figure 5:
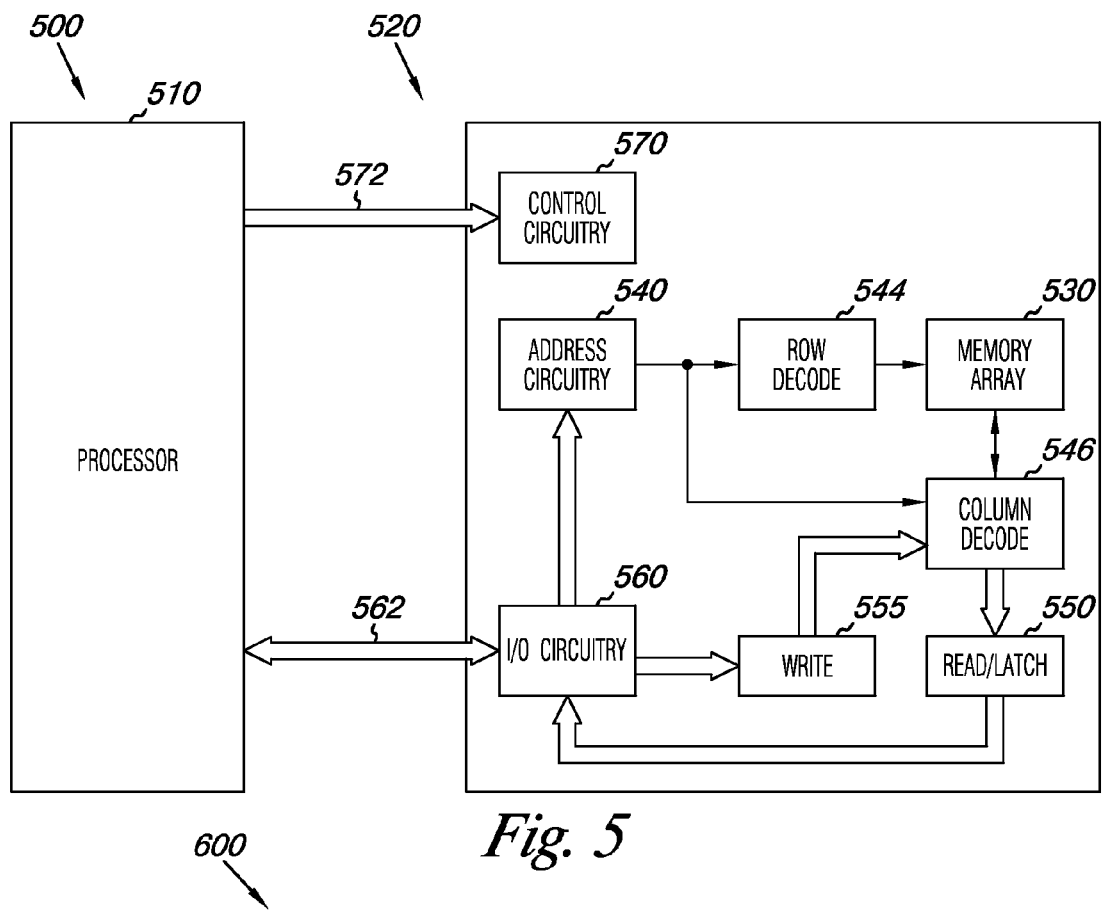
FIG. 5 illustrates a functional block diagram of an electronic memory system having at least one memory device in accordance with one or more embodiments of the present disclosure.

FIG. 5 illustrates a functional block diagram of an electronic memory system having at least one memory device in accordance with one or more embodiments of the present disclosure. Memory system 500 includes a processor 510 coupled to a non-volatile memory device 520 that includes a memory array 530 of non-volatile cells, e.g., a memory array such as array 100 shown in FIG. 1. The memory system 500 can include separate integrated circuits or both the processor 510 and the memory device 520 can be on the same integrated circuit. The processor 510 can be a microprocessor or some other type of controlling circuitry such as an application-specific integrated circuit (ASIC).

For clarity, the electronic memory system 500 has been simplified to focus on features with particular relevance to the present disclosure. The memory device 520 includes an array of non-volatile memory cells 530, which can be floating gate flash memory cells with a NAND architecture. The control gates of each row of memory cells are coupled with a select line, while the drain regions of the memory cells are coupled to sense lines. The source regions of the memory cells are coupled to source lines, as the same has been illustrated in FIG. 1. As will be appreciated by those of ordinary skill in the art, the manner of connection of the memory cells to the sense lines and source lines depends on whether the array is a NAND architecture, a NOR architecture, and AND architecture, or some other memory array architecture.

The embodiment of FIG. 5 includes address circuitry 540 to latch address signals provided over I/O connections 562 through I/O circuitry 560. Address signals are received and decoded by a row decoder 544 and a column decoder 546 to access the memory array 530. As the reader will appreciate, the number of address input connections depends on the density and architecture of the memory array 530 and that the number of addresses increases with both increased numbers of memory cells and increased numbers of memory blocks and arrays.

The memory array 530 includes non-volatile memory cells operated according to one or more embodiments described herein. The memory device 520 reads data in the memory array 530 by sensing voltage and/or current changes in the memory array columns using sense/buffer circuitry that in this embodiment can be read/latch circuitry 550. The read/latch circuitry 550 can be coupled to read and latch a row of data from the memory array 530. I/O circuitry 560 is included for bi-directional data communication over the I/O connections 562 with the processor 510. Write circuitry 555 is included to write data to the memory array 530.

Control circuitry 570 decodes signals provided by control connections 572 from the processor 510. These signals can include chip signals, write enable signals, and address latch signals that are used to control the operations on the memory array 530, including read, write, erase, and erase verify operations. In one or more embodiments, the control circuitry 570 is responsible for executing instructions from the processor 510 to perform the operating and programming embodiments of the present disclosure. The control circuitry 570 can be a state machine, a sequencer, or some other type of controller. It will be appreciated by those skilled in the art that additional circuitry and control signals can be provided, and that the memory device detail of FIG. 5 has been reduced to facilitate ease of illustration.

Figure 6:
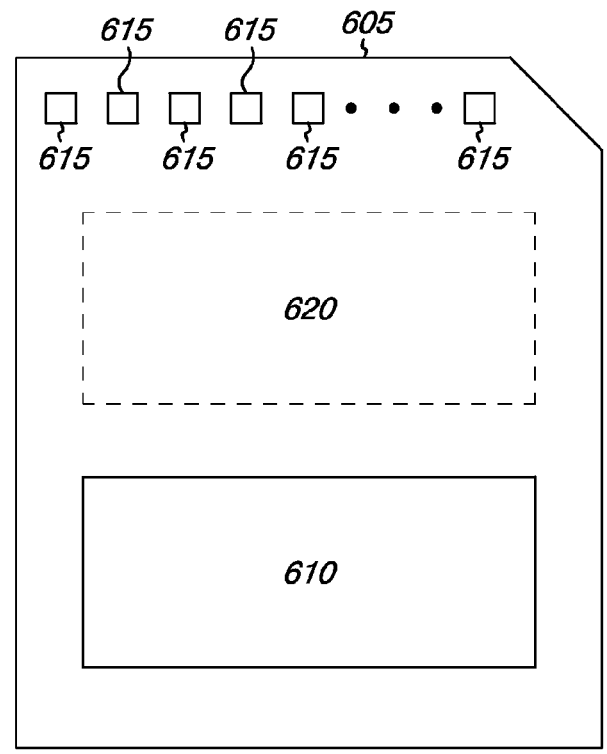
FIG. 6 illustrates a functional block diagram of a memory module having at least one memory device in accordance with one or more embodiments of the present disclosure.

FIG. 6 illustrates a functional block diagram of a memory module having at least one memory device in accordance with one or more embodiments of the present disclosure. Memory module 600 is illustrated as a memory card, although the concepts discussed with reference to memory module 600 are applicable to other types of removable or portable memory (e.g., USB flash drives) and are intended to be within the scope of "memory module" as used herein. In addition, although one example form factor is depicted in FIG. 6, these concepts are applicable to other form factors as well.

In one or more embodiments, memory module 600 will include a housing 605 (as depicted) to enclose one or more memory devices 610, though such a housing is not essential to all devices or device applications. At least one memory device 610 includes an array of non-volatile memory cells read according to one or more embodiments described herein. Where present, the housing 605 includes one or more contacts 615 for communication with a host device. Examples of host devices include digital cameras, digital recording and playback devices, PDAs, personal computers, memory card readers, interface hubs and the like. For one or more embodiments, the contacts 615 are in the form of a standardized interface. For example, with a USB flash drive, the contacts 615 might be in the form of a USB Type-A male connector. For one or more embodiments, the contacts 615 are in the form of a semi-proprietary interface, such as might be found on CompactFlash™ memory cards licensed by SanDisk Corporation, Memory Stick™ memory cards licensed by Sony Corporation, SD Secure Digital™ memory cards licensed by Toshiba Corporation and the like. In general, however, contacts 615 provide an interface for passing control, address and/or data signals between the memory module 600 and a host having compatible receptors for the contacts 615.

The memory module 600 may optionally include additional circuitry 620, which may be one or more integrated circuits and/or discrete components. For one or more embodiments, the additional circuitry 620 may include control circuitry, such as a memory controller, for controlling access across multiple memory devices 610 and/or for providing a translation layer between an external host and a memory device 610. For example, there may not be a one-to-one correspondence between the number of contacts 615 and a number of 610 connections to the one or more memory devices 610. Thus, a memory controller could selectively couple an I/O connection (not shown in FIG. 6) of a memory device 610 to receive the appropriate signal at the appropriate I/O connection at the appropriate time or to provide the appropriate signal at the appropriate contact 615 at the appropriate time. Similarly, the communication protocol between a host and the memory module 600 may be different than what is required for access of a memory device 610. A memory controller could then translate the command sequences received from a host into the appropriate command sequences to achieve the desired access to the memory device 610. Such translation may further include changes in signal voltage levels in addition to command sequences.

The additional circuitry 620 may further include functionality unrelated to control of a memory device 610 such as logic functions as might be performed by an ASIC. Also, the additional circuitry 620 may include circuitry to restrict read or write access to the memory module 600, such as password protection, biometrics or the like. The additional circuitry 620 may include circuitry to indicate a status of the memory module 600. For example, the additional circuitry 620 may include functionality to determine whether power is being supplied to the memory module 600 and whether the memory module 600 is currently being accessed, and to display an indication of its status, such as a solid light while powered and a flashing light while being accessed. The additional circuitry 620 may further include passive devices, such as decoupling capacitors to help regulate power requirements within the memory module 600.

CONCLUSION

Methods, devices, modules, and systems for reading non-volatile memory cells have been shown. One method includes programming a number of memory cells coupled in series between a first and second select gate transistor where edge cells are coupled adjacent to the select gate transistors and non-edge cells are coupled between the edge cells. The method includes programming a non-edge cell within a first threshold voltage (Vt) distribution. The method also includes programming an edge cell within a second Vt distribution, wherein the first and second Vt distributions correspond to a same one of a number of data states, and wherein the second Vt distribution is different than the first Vt distribution for at least one of the number of data states.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for operating an array of memory cells, comprising:
    programming a number of memory cells coupled in series between a first and second select gate transistor where edge cells are coupled adjacent to the select gate transistors and non-edge cells are coupled between the edge cells;
    programming a non-edge cell within a first threshold voltage (Vt) distribution; and
    programming an edge cell within a second Vt distribution, wherein the first and second Vt distributions correspond to a same one of a number of data states, and wherein the second Vt distribution is different than the first Vt distribution for an erased state and two data states closest in magnitude to the erased state, and wherein the second Vt distribution is substantially equal to the first Vt distribution for all other data states.

2. The method of claim 1, where the method includes programming the edge memory cell within the second Vt distribution that has a greater average magnitude than the first Vt distribution.

3. The method of claim 2, where the method includes programming the edge memory cell within the second Vt distribution that has a greater average magnitude than the first Vt distribution by less than one volt.

4. The method of claim 1, where the method includes programming the edge memory cell within the second Vt distribution that has a narrower range of voltages than the first Vt distribution.

5. A method for operating an array of memory cells, comprising:
    sensing a number of memory cells coupled in series between a first and second select gate transistor where edge cells are coupled adjacent to the select gate transistors and non-edge cells are coupled between the edge cells;
    sensing a non-edge cell with a first sensing voltage; and
    sensing an edge cell with a second sensing voltage, wherein the first and second sensing voltages correspond to a same one of a number of data states, and wherein the second sensing voltage has a magnitude that is greater than the first sensing voltages by less than one volt for corresponding data states.

6. A memory device comprising:
    an array of memory cells including memory cells coupled in series between a first and second select gate transistor such that edge cells are coupled adjacent to the select gate transistors and non-edge cells are coupled between the edge cells; and
    control circuitry coupled to the array of memory cells and configured to:
        sense non-edge cells with a first number of sensing voltages corresponding to a number of data states; and
        sense edge cells with a second number of sensing voltages corresponding to the number of data states, wherein each of the second number of sensing voltages have a magnitude that is greater than each of the first number of sensing voltages by less than one volt for corresponding data states.

7. The device of claim 6, wherein the control circuitry is configured to perform an erase verify operation using a first erase verify voltage for non-edge cells and a second erase verify voltage for edge cells that is different than the first erase verify voltage.

8. The device of claim 7, wherein the control circuitry is configured to perform the erase verify operation using a second erase verify voltage that is greater in magnitude than the first erase verify voltage.

9. The device of claim 8, wherein the control circuitry is configured to use the second erase verify voltage at a magnitude that is greater than the first erase verify voltage by less than one volt.

10. A memory device comprising:
    an array of memory cells including memory cells coupled in series between a first and second select gate transistor such that edge cells are coupled adjacent to the select gate transistors and non-edge cells are coupled between the edge cells; and
    control circuitry coupled to the array of memory cells and configured to:
        apply programming pulses to a non-edge cell such that the non-edge cell stores a charge within a first threshold voltage (Vt) distribution; and
        apply programming pulses to an edge cell such that the edge cell stores a charge within a second Vt distribution, wherein the first and second Vt distributions correspond to a same one of a number of data states, and wherein the second Vt distributions have a narrower range of voltages than the first Vt distributions for two data states that are closest in magnitude to an erased state.

11. The device of claim 10, wherein, the control circuitry is configured to apply programming pulses to the edge cell such that the edge cell stores the charge within the second Vt distribution having a greater average magnitude than the first Vt distribution.

12. The device of claim 11, wherein the second Vt distribution has the greater average magnitude than the first Vt distribution by less than one volt.

13. The device of claim 11, wherein the second Vt distribution has the greater average magnitude than the first Vt distribution corresponding to each of the number of data states.

14. The device of claim 11, wherein the second Vt distribution has the greater average magnitude than the first Vt distribution for a corresponding one of the number of data states that is closest in magnitude to an erased state.

15. An electronic system, comprising:
    a processor; and
    a memory device coupled to the processor, the memory device comprising:
        at least one array of memory cells including memory cells coupled in series between a first and second select gate transistor such that edge cells are coupled adjacent to the select gate transistors and non-edge cells are coupled between the edge cells; and
        control circuitry coupled to the array and configured to:
            program at least one non-edge cell to one of a number of states;
            program at least one edge cell to one of the number of states, wherein for an erased state and two data states closest in magnitude to the erased state, control circuitry programs the edge cell such that it stores a charge with a greater magnitude than the non-edge cell, and wherein for all other data states, control circuitry programs the edge cell such that it stores charge with a substantially equal magnitude as the non-edge cell;

sense at least one non-edge cell with a first number of sensing voltages; and sense at least one edge cell with a second number of sensing voltages, wherein the first and second numbers of sensing voltages are used to sense common states for the non-edge and edge cells, and wherein the second number of sensing voltages are greater in magnitude than the first number of sensing voltages corresponding to the erased state and the two data states closest in magnitude to the erased state.

16. The system of claim 15, wherein the control circuitry is configured to apply a pass-read voltage with a greater magnitude to the at least one edge cell than to the at least one non-edge cell.

17. The system of claim 15, wherein the control circuitry is configured to apply an erase verify voltage to the at least one edge cell that is greater in magnitude than an erase verify voltage applied to the at least one non-edge cell.

* * * * *